(12) United States Patent
Zültzke et al.

(10) Patent No.: US 7,311,939 B2
(45) Date of Patent: Dec. 25, 2007

(54) VACUUM COATING UNIT AND A METHOD FOR THE DIFFERENTIATED COATING OF SPECTACLE LENSES

(75) Inventors: Walter Zültzke, Maintal (DE); Markus Fuhr, Eppstein (DE)

(73) Assignee: Leybold Optics GmbH, Alzenau (DE)

( * ) Notice: Subject to any disclaimer, the term of this patent is extended or adjusted under 35 U.S.C. 154(b) by 0 days.

(21) Appl. No.: 11/294,093

(22) Filed: Dec. 5, 2005

(65) Prior Publication Data

US 2006/0130760 A1  Jun. 22, 2006

Related U.S. Application Data

(63) Continuation of application No. PCT/DE2004/001138, filed on Jun. 3, 2004.

(30) Foreign Application Priority Data

Jun. 3, 2003  (DE) ................................ 103 24 928

(51) Int. Cl.
*C23C 14/24* (2006.01)

(52) U.S. Cl. .................... 427/164; 427/166; 427/255.5; 118/720; 118/726; 118/730

(58) Field of Classification Search ................ 118/720; 427/255.5, 164, 166
See application file for complete search history.

(56) References Cited

U.S. PATENT DOCUMENTS

| 4,380,212 | A | * | 4/1983 | Kraus ......................... 118/720 |
| 4,449,478 | A | * | 5/1984 | Kraus ......................... 118/720 |
| 4,485,124 | A | | 11/1984 | Ciparisso |
| 5,236,510 | A | * | 8/1993 | Brennesholtz .............. 118/721 |

FOREIGN PATENT DOCUMENTS

DE  31 31 583 A1  7/1982

* cited by examiner

*Primary Examiner*—Richard Bueker
(74) *Attorney, Agent, or Firm*—Laurence A. Greenberg; Werner H. Stemer; Ralph E. Locher

(57) ABSTRACT

Substrates, such as spectacle lenses for example, may be provided with a coating which is not uniform by way of screens. The screens are aperture rings, arranged concentric to a symmetry axis of the vaporising crucible in a vacuum coating unit, by way of a screen holder. The spectacle lenses are disposed on a substrate holder also in circles about the symmetry axis. The shadows cast by the aperture rings cover but a partial region of the spectacles lenses such that those regions of the lenses receive less coating than in the unshaded free regions. The aperture rings are exchangeable in order to match the coating process to the customer requirements. Furthermore, the separation of the subtrate holder from the aperture rings is adjustable.

11 Claims, 1 Drawing Sheet

VACUUM COATING UNIT AND A METHOD FOR THE DIFFERENTIATED COATING OF SPECTACLE LENSES

CROSS-REFERENCE TO THE RELATED APPLICATION

This is a continuing application, under 35 U.S.C. §120, of copending international application No. PCT/DE2004/001138, filed Jun. 3, 2004, which designated the United States; this application also claims the priority, under 35 U.S.C. §119, of German patent application No. 103 24 928.1, filed Jun. 3, 2003; the prior applications are herewith incorporated by reference in their entirety.

BACKGROUND OF THE INVENTION

Field of the Invention

The invention relates to a vacuum coating unit for the simultaneous coating of a plurality of substrates, in particular of spectacle lenses, in a vacuum chamber, wherein an evaporation crucible and, above the latter, a dome serving as a substrate holder are arranged, on the underside of which in each case a plurality of substrates are held at radially equal distances on circles about a vertical axis of symmetry of the evaporator crucible in a position which is invariant relative to the dome. A rotary drive rotates the dome about the axis of symmetry. The substrates are moved on circular paths about the axis of symmetry during rotation of the dome. Screens are provided for the partial shadowing of the substrates.

An apparatus of that type is disclosed, for example, in German published patent application DE 31 31 583 A1. With the arrangement described there, extremely uniform coatings of the substrates, that is to say for example of the spectacle lenses, can be achieved, which can be improved further by the substrate holder being arranged to rotate and by the substrates being moved on circular paths in the conical evaporation cone emerging from the evaporator crucible.

As long as it is a matter, for example, of coatings for rendering spectacle lenses nonreflective, a layer application which is uniformly thick over the entire substrate area is desired. For some applications, however, for example for aesthetic reasons, layer thickness or color variations are of interest. In this case, only circular sections of the spectacle lenses are provided with a tint which, in relation to the subsequent installation in the spectacle frame, are located in the upper zone of the spectacle lenses, while the lower zone is not tinted or tinted only weakly.

Screens have therefore already been proposed which shadow regions of the substrate area to be coated with respect to the evaporator crucible, so that the zones of the substrate which lie in the shadow or half-shadow of this screen are vapor-coated less intensely than the exposed zones. In the solutions proposed hitherto, individual screens are located immediately in front of the substrates, which inter alia leads to undesired sharp transitions between the individual zones. Since, in addition, the individual screens are fixed to the substrate holder, this arrangement is overall inflexible to handle, since, when the screens are replaced, they have to be readjusted individually in relation to the respective substrate.

SUMMARY OF THE INVENTION

It is accordingly an object of the invention to provide a vacuum unit and a method which overcome the above-mentioned disadvantages of the heretofore-known devices and methods of this general type and which render possible the achievement, in the simplest possible way, of nonuniform coatings, that is to say of differentiated coating of the substrates.

With the foregoing and other objects in view there is provided, in accordance with the invention, a vacuum coating unit for simultaneously coating a plurality of substrates, such as spectacle glasses, in a vacuum chamber, comprising:
  an evaporation crucible defining a vertical axis of symmetry;
  a substrate holder formed as a dome disposed above the evaporation crucible and having an underside configured to hold a plurality of substrates at radially equal intervals on circles about a vertical axis of symmetry of the evaporator crucible and stationary relative to the dome;
  a rotary drive for rotating the dome about the axis of symmetry, whereby the substrates are moved on circular paths about the axis of symmetry; and
  screens disposed to partially shadow the substrates relative to the evaporation crucible, the screens forming a continuous aperture ring for each respective ring of substrates, and the aperture ring being disposed, circumferentially relative to the axis of symmetry, within an cone formed between the evaporator crucible and the dome.

In order to solve the above-noted and other problems, the invention provides that in each case the screens for the substrates arranged in a circle form a continuous aperture ring, which is arranged circumferentially in relation to the axis of symmetry, between the evaporator crucible and the dome and within the cone formed by the evaporator crucible and the dome.

An aperture ring thus acts for a group of substrates which are fitted to the substrate holder on a circle. Instead of providing a screen for each individual substrate, here an entire group can be covered by a single screen in the form of an aperture ring. The great advantage of this arrangement thus resides in the fact that an aperture ring effects shadowing of a plurality of substrates located at the same radial distance from the axis of symmetry. Replacement of the screens can therefore be carried out easily and quickly.

Furthermore, a continuous color or thickness transition results, since the aperture rings are held at a certain distance from the substrates, so that half shadowing occurs, wherein the substrates are coated somewhat more weakly than in the unshadowed zones but more intensely than in the core shadow.

In order to achieve an optimum screening effect, provision is made for the aperture rings to be fixed to arms of a screen holder aimed into the evaporator cone. These arms should be designed to be as thin as possible, so that they themselves have no shadowing effect. The screen holder is preferably fixed to the base of the evaporator chamber and defines a plane wherein the aperture rings are located.

These arms can be provided with markings or grids, which simplify centering of the aperture rings.

The aperture rings preferably have the form of a closed circular ring. This has the advantage that they are easy to mount. In addition, the corresponding zone of the substrates always remains in the shadow of the aperture ring during the movement of the substrates about the axis of symmetry.

In order to obtain the transition between the coated and partly coated zones even more continuously, it is proposed that the aperture rings have a periodic edge structure at their outer or inner edge, whose period is considerably smaller than the distances between adjacent substrates held on the dome. These are preferably wave-like or sawtooth-like patterns.

The course of the transition can further be varied by changing the distance of the aperture rings from the substrate holder. The more closely to the substrate the aperture rings are located, the sharper the transition becomes. In order to be able to configure the transition to be softer or harder, the invention provides for the distance between the substrate holder and the aperture ring to be adjustable. This is preferably achieved by the screen holder being vertically adjustable. For this purpose, inside or outside the vacuum vessel, a vertical drive is provided for the screen holder. In addition, a controller which can be actuated during the coating operation is provided for the drive. Although this may also be the simplest solution for varying the distance between the screens and the substrates, thought can also be given to displacing the substrate holder vertically.

Another possible way of achieving a smooth transition between the various zones consists in arranging the aperture rings slightly eccentrically and driving the substrate holder in rotation. This results in a core zone which is always shadowed and an edge zone which, depending on the angular position of the substrate holder in relation to the axis of eccentricity, is sometimes shadowed and sometimes exposed in a revolution of the substrate holder, so that a transition zone is defined by this edge zone. In order to cover this arrangement as well, the formulation "substantially concentric arrangement of the aperture rings" should also include arrangements wherein the aperture rings are arranged slightly eccentrically in relation to the axis of symmetry but a circular ring remaining which is always covered by the aperture ring.

The apparatus described is used in particular for the differentiated coating of spectacle lenses with a colored absorption layer. For this purpose, a plurality of spectacle lenses is inserted into the unit previously described, the aperture rings being chosen and arranged in such a way that their outer and inner edge forms the transition between two zones of circular section shape on the spectacle lenses, one zone being coated and the other zone remaining free.

Other features which are considered as characteristic for the invention are set forth in the appended claims.

Although the invention is illustrated and described herein as embodied in a vacuum coating unit and a method for the differentiated coating of spectacle lenses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
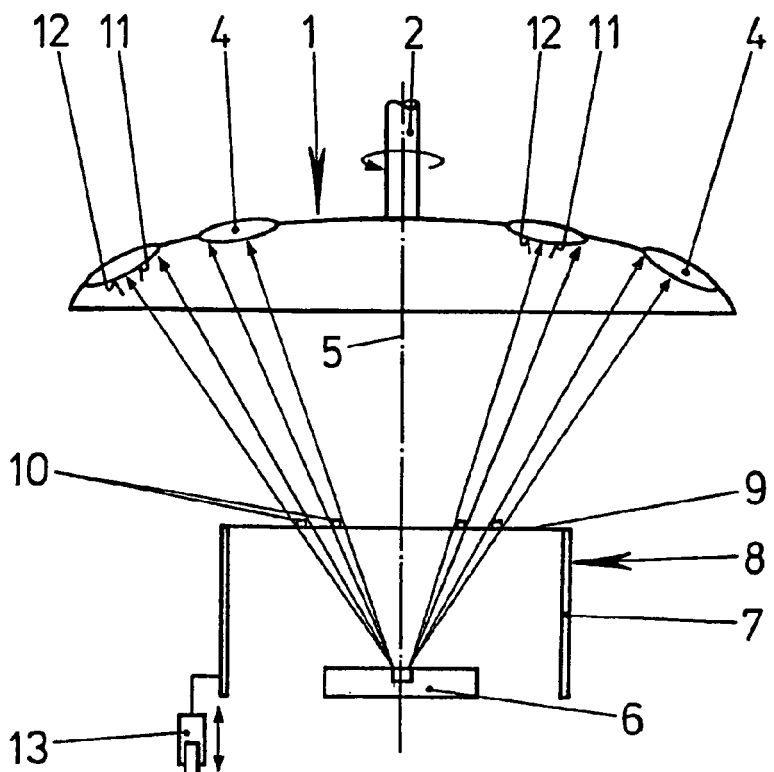
FIG. 1 is a schematic illustration and a side view of the combination of a substrate holder and an evaporator crucible in a schematic illustration and in side view.
Figure 2:
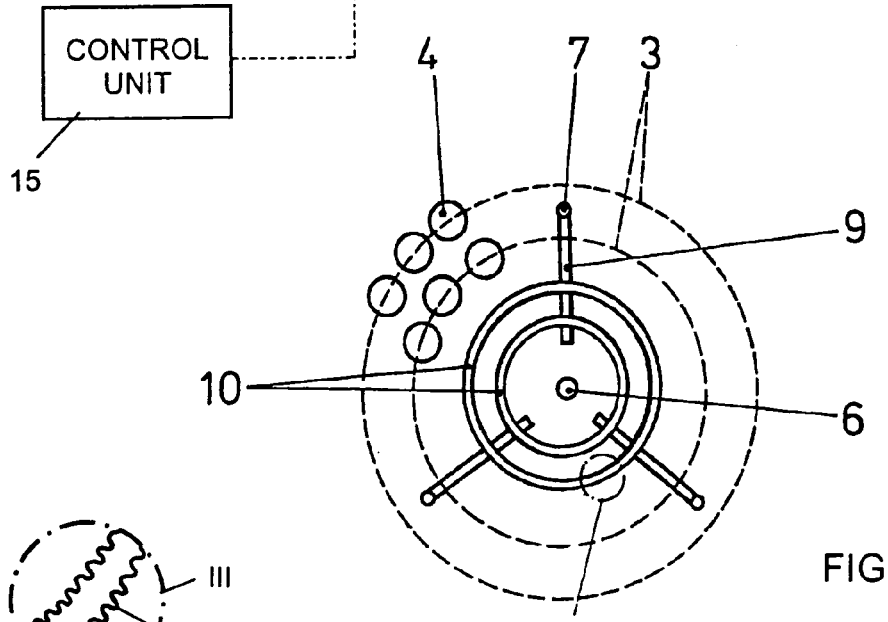
FIG. 2 is plane view of the configuration according to FIG. 1.

Referring now to the figures of the drawing in detail and first, particularly, to FIG. 1 thereof, there is shown a substrate holder 1 in the shape of a dome, which is fitted underneath a cover of a vacuum vessel, not specifically illustrated here, and can be rotated about a vertical axis by way of a rotary drive 2. On the inner side of the dome, on two (or more) circles 3, there are a plurality of spectacle lenses 4 still present in blank form, whose radial spacing from the axis of symmetry 5 is identical for each circle 3. This also becomes clear once more in the plan view of FIG. 2. They are connected firmly to the dome and thus execute no rotation relative to the dome as is the case in so-called planetary systems.

Underneath the substrate holder 1 there is an evaporator crucible 6, wherein the material which is to be applied to the lenses 4 is evaporated. There are various possible ways of doing this, which are not to be explained in more detail here, since they are known to those skilled in the art with sufficient detail. For instance, a bombardment with electrons can be carried out. Distributed around the evaporator crucible 6 and fixed to the base of the evaporator vessel, there are three supports 7, which form a screen holder 8. Originating from these supports 7, arms 9 are oriented inward, on which aperture rings 10 rest concentrically with respect to the axis of symmetry 5. Each aperture ring is intrinsically self-contained and has an inner and outer edge which run coaxially in relation to each other.

An aperture ring 10 is provided for each circle 3 on the dome. This can likewise be seen clearly in FIG. 2. Starting from the evaporator crucible, each aperture ring 10 forms a shadow zone 11 on the spectacle lenses 4 which is at least more weakly vapor coated than the exposed, unshadowed free zone 12. The farther the aperture rings are disposed away from the substrates, the more evaporated material also reaches the (geometrically defined) shadow zone 11, by which means a type of half-shadow zone is formed. The transition between the zones runs transversely over the spectacle lens, so that the two zones each form a circular section.

In order to obtain sharp transitions, the aperture rings 10 are moved close to the substrate holder 1. For a somewhat broader transition between the shadow zone 11 and the free zone 12, a greater distance is chosen between the substrate holder 1 and the aperture rings 10. For this purpose, within the vessel a vertical drive 13 is fitted to the screen holder 8, with which the screen holder 8 can be moved in the vertical direction, that is to say parallel to the axis of symmetry 5. The vertical drive 13 can be actuated by a control unit or controller 15 during the coating operation.

Figure 3C:
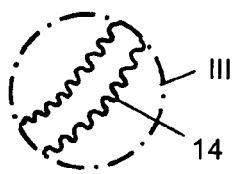
FIGS. 3A, 3B, and 3C are enlarged illustrations of a partial view, identified with numeral III in FIG. 2, of an aperture ring.
Figure 3A:
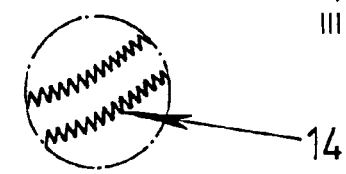
Figure 3B:
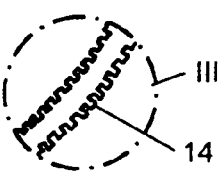

A further possible way of configuring the transitions between the coated free zone 12 and the shadow zone 11 more smoothly is to configure the outer and inner edge 14 of the aperture rings 10 in the form of waves or saw teeth, as is illustrated by the enlarged details III as an aperture ring 10 in FIGS. 3A, 3B, 3C. The period of the structure is small as compared with the size of the spectacle lenses, and it is small with regard to the spacing distance between the substrates. In particular, the amplitude of the pattern influences the course of the thickness of the absorption layer or tint in the transition between the zones.

We claim:

1. A vacuum coating unit for simultaneously coating a plurality of substrates in a vacuum chamber, comprising:
    an evaporation crucible defining a vertical axis of symmetry;
    a substrate holder formed as a dome disposed above said evaporation crucible and having an underside configured to hold a plurality of substrates at radially equal intervals in a ring of substrates about the vertical axis of symmetry of said evaporation crucible and stationary relative to said dome;
    a rotary drive for rotating said dome about said axis of symmetry, whereby the substrates are moved on circular paths about said axis of symmetry; and
    a continuous aperture ring formed of one or more screens disposed to partially shadow the substrates relative to said evaporation crucible, said continuous aperture ring being associated, with regard to an evaporation from said evaporation crucible to said substrate holder, with a respective ring of substrates, said aperture ring being a closed circular ring disposed, circumferentially relative to said axis of symmetry, within a cone formed between said evaporator crucible and said dome, and said aperture ring having a circumferentially periodic edge structure at an outer edge or inner edge thereof, said edge structure being a pattern selected from the group consisting of a wave pattern and a sawtooth pattern and having a period substantially smaller than spacing distances between mutually adjacent substrates held on said dome.

2. The vacuum coating unit according to claim 1, wherein the substrates are spectacle lenses and said substrate holder is configured to hold said spectacle lenses.

3. The vacuum coating unit according to claim 1, which comprises a plurality of arms of a screen holder holding said aperture ring, said arms projecting into said cone in a plane above said crucible.

4. The vacuum coating unit according to claim 1, wherein a distance between said dome and said aperture ring is adjustable.

5. The vacuum coating unit according to claim 4, wherein said screen holder is vertically adjustable.

6. The vacuum coating unit according to claim 4, which comprises a vertical drive coupled to said screen holder, said vertical drive being actuatable by a controller during a coating operation.

7. The vacuum coating unit according to claim 1, wherein plural aperture rings are arranged coaxially with respect to the axis of symmetry.

8. The vacuum coating unit according to claim 1, wherein plural aperture rings are arranged eccentrically with respect to said axis of symmetry and said substrate holder is rotatably disposed about said axis of symmetry.

9. The vacuum coating unit according to claim 1, wherein said continuous aperture ring is one of a plurality of aperture rings concentrically disposed about said vertical axis of symmetry and each associated with a respective ring of substrates disposed on said substrate holder.

10. A method for coating an arcuate section of a spectacle lens with an absorption layer, which comprising the following steps:
    (a) providing the vacuum coating unit according to claim 1;
    (b) filling the crucible with a material for forming a desired absorption layer on the spectacle lens;
    (c) fitting a plurality of spectacle lenses to be coated in the same way to the dome; and
    (d) fitting the aperture rings in such a way that an imaginary extension from the crucible to the dome along the inner or outer edge of the aperture ring determines the transition between the coated and uncoated arcuate sections of a respective spectacle lens on the associated dome ring.

11. A vacuum coating unit for simultaneously coating a plurality of substrates in a vacuum chamber, comprising:
    an evaporation crucible defining a vertical axis of symmetry;
    a substrate holder formed as a dome disposed above said evaporation crucible and having an underside configured to hold a plurality of substrates in one or more rings of substrates about a vertical axis of symmetry of said evaporator crucible and stationary relative to said dome;
    a rotary drive for rotating said dome about said axis of symmetry, whereby the substrates are moved on circular paths about said axis of symmetry; and
    a continuous aperture ring disposed between said evaporation crucible and said substrate holder to partially shadow the substrates relative to said evaporation crucible, said continuous aperture ring being formed with an edge structure having a pattern selected from the group consisting of a wave pattern and a sawtooth pattern.

* * * * *